(12) United States Patent
Aharonov et al.

(10) Patent No.: US 9,909,210 B2
(45) Date of Patent: Mar. 6, 2018

(54) CHEMICAL VAPOR DEPOSITION OF WEAR RESISTANT COATINGS ONTO PISTON RING RUNNING FACE, SIDE FACE, AND INNER DIAMETER IN ONE COATING RUN

(71) Applicant: Federal-Mogul Corporation, Southfield, MI (US)

(72) Inventors: Robert Aharonov, West Bloomfield, MI (US); Haron Gekonde, West Bloomfield, MI (US)

(73) Assignee: Federal-Mogul LLC, Southfield, MI (US)

( * ) Notice: Subject to any disclaimer, the term of this patent is extended or adjusted under 35 U.S.C. 154(b) by 1127 days.

(21) Appl. No.: 14/051,696

(22) Filed: Oct. 11, 2013

(65) Prior Publication Data

US 2014/0102599 A1 Apr. 17, 2014

Related U.S. Application Data

(60) Provisional application No. 61/712,439, filed on Oct. 11, 2012, provisional application No. 61/787,231, filed on Mar. 15, 2013.

(51) Int. Cl.
*C23C 16/00* (2006.01)
*C23C 16/32* (2006.01)
(Continued)

(52) U.S. Cl.
CPC ............ *C23C 16/32* (2013.01); *B23P 15/065* (2013.01); *C21D 9/40* (2013.01); *C23C 16/34* (2013.01);
(Continued)

(58) Field of Classification Search
CPC ......... C23C 16/32; C23C 16/34; C23C 16/36; C23C 16/403
See application file for complete search history.

(56) References Cited

U.S. PATENT DOCUMENTS 4,085,490 A 4/1978 McCormick et al.
4,307,890 A * 12/1981 Cromwell ................. F16J 9/26
277/441

(Continued)

FOREIGN PATENT DOCUMENTS

JP S59200868 A 11/1984
JP H01224128 A 9/1989
(Continued)

OTHER PUBLICATIONS

International Search Report dated Mar. 24, 2014 (PCT/US2013/064462).

*Primary Examiner* — Kelly M Gambetta
(74) *Attorney, Agent, or Firm* — Robert L. Stearns; Dickinson Wright, PLLC

(57) ABSTRACT

A method of coating all surfaces of a plurality of piston rings in a single run by a chemical vapor deposition (CVD) process is provided. The method can include providing a coil formed of an iron-based material; heating the coil; and depositing a coating on all surfaces of the coil during a single continuous period of time, without having to move the coil during the CVD process. The coil is maintained in a fixed position during the depositing step. The method next includes splitting the coil into a plurality of separate coated piston rings. Alternatively, the method can include providing a plurality of stacked keystone piston ring bodies; and disposing a cylinder around the stack to maintain the keystone piston ring bodies in position while depositing the CVD coating on all surfaces of the keystone piston ring bodies during the single coating run.

20 Claims, 3 Drawing Sheets

(51) Int. Cl.
  *C23C 16/34* (2006.01)
  *C23C 16/36* (2006.01)
  *C23C 16/40* (2006.01)
  *C21D 9/40* (2006.01)
  *C23C 16/455* (2006.01)
  *F16J 9/26* (2006.01)
  *B23P 15/06* (2006.01)

(52) U.S. Cl.
  CPC ............ *C23C 16/36* (2013.01); *C23C 16/403* (2013.01); *C23C 16/45578* (2013.01); *F16J 9/26* (2013.01)

(56) References Cited

U.S. PATENT DOCUMENTS

| | | | |
|---|---|---|---|
| 4,531,985 A | 7/1985 | Tommis | |
| 5,794,943 A * | 8/1998 | Atmur | F16J 9/28 277/441 |
| 5,809,643 A * | 9/1998 | Swick | B21D 53/16 29/557 |
| 5,852,859 A | 12/1998 | Swick | |
| 6,821,497 B2 * | 11/2004 | Moronuki | C23C 16/30 423/415.1 |
| 2002/0175476 A1 * | 11/2002 | Chinou | F16J 9/26 277/440 |
| 2010/0221427 A1 * | 9/2010 | Fry | C23C 16/045 427/255.28 |
| 2012/0291705 A1 | 11/2012 | Fry | |
| 2013/0043659 A1 * | 2/2013 | Ito | F16J 9/26 277/443 |

FOREIGN PATENT DOCUMENTS

| | | |
|---|---|---|
| JP | 2002097573 A | 4/2002 |
| JP | 2003074707 A | 3/2003 |
| JP | 2003113941 A | 4/2003 |
| JP | 2007321859 A * | 12/2007 |
| JP | 2008128283 A | 6/2008 |
| JP | 2009285807 A | 12/2009 |
| WO | 2011093464 A1 | 8/2011 |

* cited by examiner

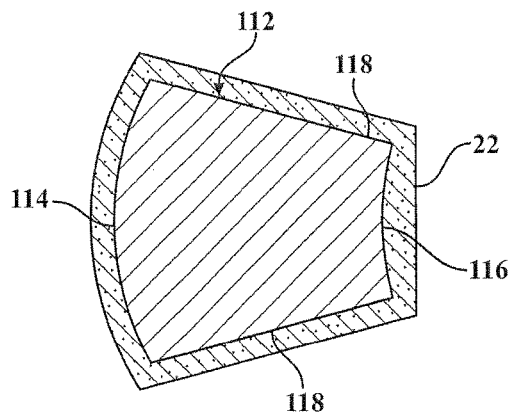
FIG. 2A
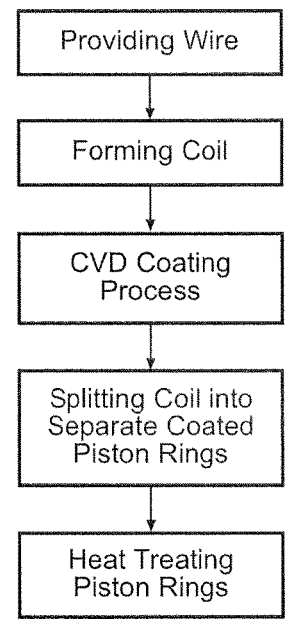
FIG. 3
FIG. 4
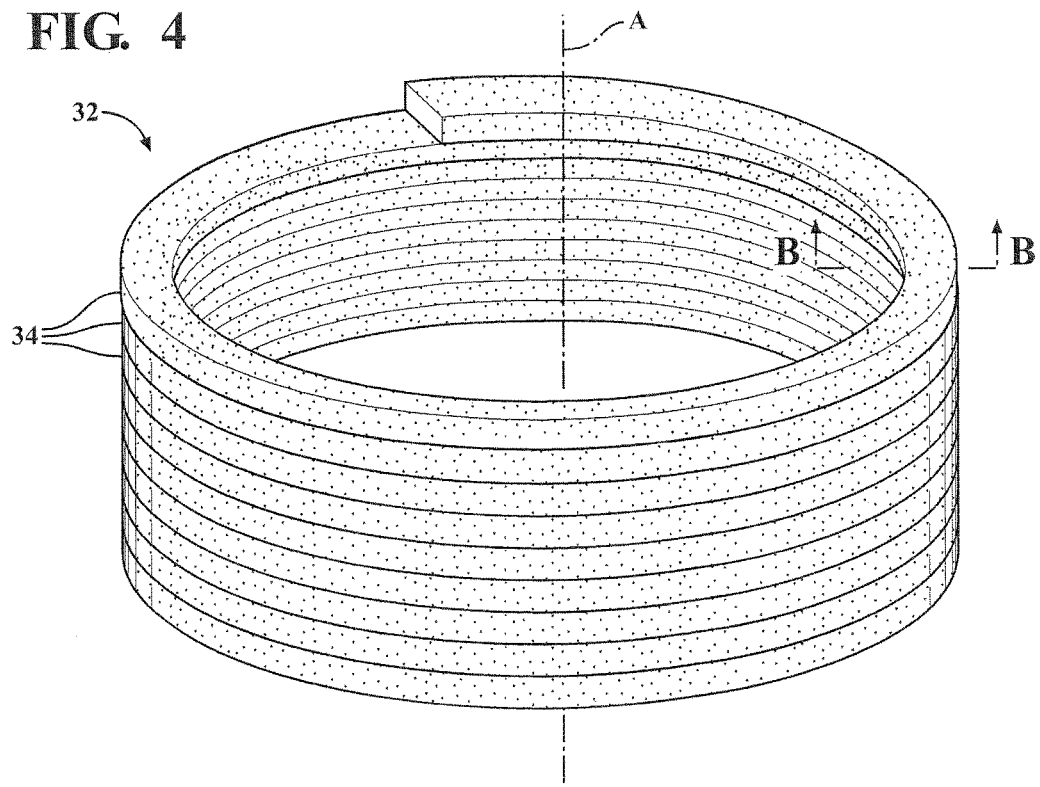

CHEMICAL VAPOR DEPOSITION OF WEAR RESISTANT COATINGS ONTO PISTON RING RUNNING FACE, SIDE FACE, AND INNER DIAMETER IN ONE COATING RUN

CROSS REFERENCE TO RELATED APPLICATIONS

This U.S. utility patent application claims the benefit of U.S. Provisional Patent Application Ser. No. 61/712,439, filed Oct. 11, 2012, and U.S. Provisional Patent Application Ser. No. 61/787,231, filed Mar. 15, 2013, which are incorporated herein by reference in their entirety.

BACKGROUND OF THE INVENTION

1. Field of the Invention

The invention relates generally to piston rings for internal combustion engines, and more particularly to coated piston rings, and methods of forming the coated piston rings.

2. Related Art

A piston of a reciprocating engine, such as an internal combustion engine, typically includes rings disposed in grooves along the outer diameter of the piston. The piston rings facilitate guiding of the piston during reciprocation in a cylinder bore. The piston rings also seal combustion gases and inhibit the upward passage of oil. The piston rings are subject to wear as they move along the cylinder bore due to gas load and their own inherent load. Accordingly, the piston rings are typically coated or treated to enhance wear resistance. For example, the piston rings may be nitrided, coated with chromium, or coated with a ceramic, which may be applied by physical vapor deposition (PVD).

SUMMARY OF THE INVENTION

The invention provides methods of forming a plurality of coating piston rings. One method comprises the steps of: providing a coil formed of a first metal material and including a plurality of surfaces; applying a coating to all surfaces of the coil during a single period of time by a chemical vapor deposition (CVD) process; and splitting the coated coil into a plurality of coated piston rings.

The invention also provides a method of forming a plurality of coated keystone piston rings. This method includes providing a stack of keystone piston ring bodies each formed of a first metal material; and applying a coating to all surfaces of the keystone piston ring bodies during a single period of time by a CVD process.

The CVD process provides coated piston rings with exceptional wear resistance. In addition, the coated piston rings can be formed with reduced manufacturing time and costs, compared to piston rings formed using methods of the prior art, which require multiple coating runs to coat all surfaces of the piston rings.

BRIEF DESCRIPTION OF THE DRAWINGS

Other advantages of the present invention will be readily appreciated, as the same becomes better understood by reference to the following detailed description when considered in connection with the accompanying drawings, wherein:

FIG. 2A is a cross-sectional view of the coated keystone piston ring of FIG. 2 along line A-A;

FIG. 3 illustrates an exemplary method used to form the coated piston rings;

FIG. 4 shows a coil used to form the coated piston ring of FIG. 1;

DETAILED DESCRIPTION

The invention provides improved methods of forming a plurality of coated piston rings 10, 110 for reciprocating engine applications, such as internal combustion engines. The method of forming the coated piston rings 10, 110 includes a chemical vapor deposition (CVD) process and requires only a single coating run, which reduces manufacturing time and costs, compared to methods requiring multiple coating runs. The CVD process also provides coated piston rings 10, 110 with exceptional wear resistance.

Figure 1:
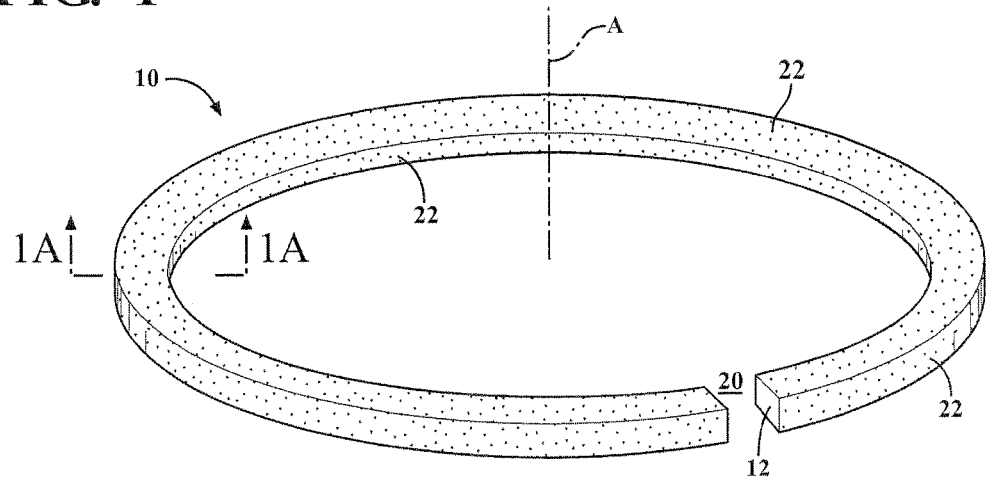
FIG. 1 is a perspective view of a coated piston ring formed according to one exemplary method.
Figure 2:
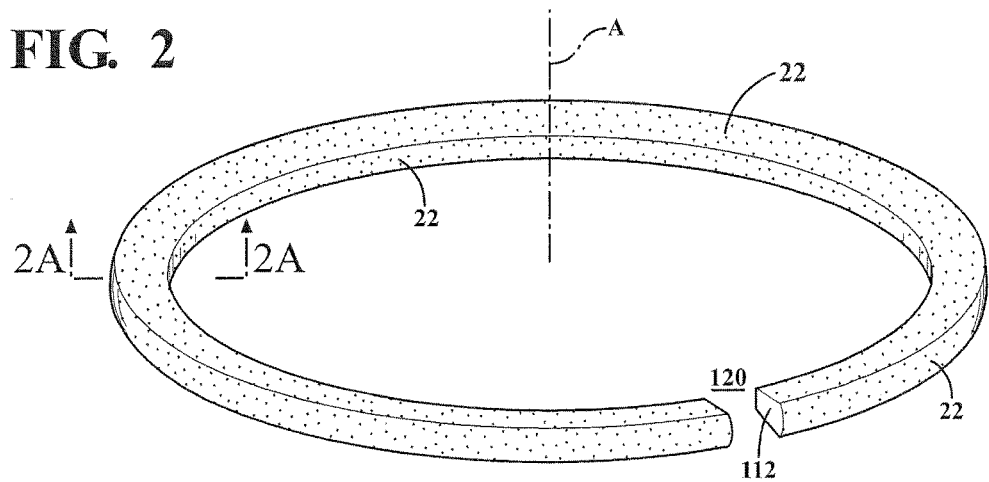
FIG. 2 is a perspective view of a coated keystone piston ring formed according to another exemplary.

FIGS. 1 and 2 are examples of coated piston rings 10, 110 formed according to methods of the subject invention. The coated piston rings 10, 110 are typically disposed in grooves along the outer diameter of a piston (not shown) to facilitate guiding the piston during reciprocation in a cylinder bore, while also sealing combustion gases and inhibiting the upward passage of oil. Each coated piston ring 10, 110 may be disposed adjacent or between other coated piston rings 10, 110.

The coated piston ring 10, 110 includes a ring body 12, 112 extending circumferentially around a center axis A, as shown in FIGS. 1 and 2. The body 12, 112 of the coated piston ring 10, 110 is typically formed of an iron-based material, such as cast iron, steel, or cast steel, but may be formed of another material capable of handling the conditions of a reciprocating engine. The ring body 12, 112 presents an outer diameter surface 14, 114, an inner diameter surface 16, 116 facing opposite the outer diameter surface 14, 114, and side surfaces 18, 118 spacing the outer diameter surface 14, 114 and inner diameter surface 16, 116 from one another. The ring body 12, 112 is typically split such that it presents an opening 20, 120 along each of the surfaces 14, 114, 16, 116, 18, 118. The ring body 12, 112 may be full-face, semi-inlaid, or fully-inlaid. For example, the ring body 12, 112 may present a groove (not shown) along the outer diameter surface 14, 114, or may include a distinct second metal material (not shown) embedded in the outer diameter surface 14, 114.

Figure 1A:
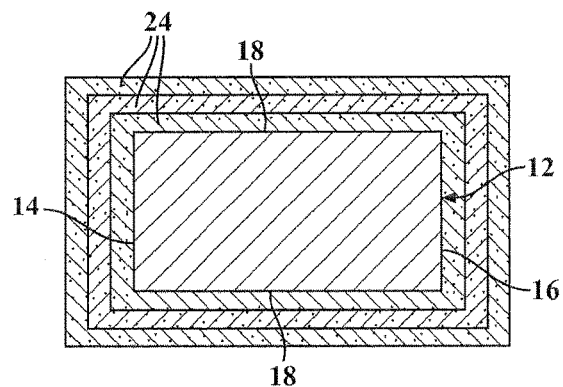
FIG. 1A is a cross-sectional view of the coated piston ring of FIG. 1 along line A-A.

The coated piston ring 10 of FIG. 1 comprises a standard design. A cross-sectional view of the standard piston ring 10 is shown in FIG. 1A. The coated piston ring 110 of FIG. 2 is referred to as a "keystone" piston ring. FIG. 2A is a cross-sectional view of the coated keystone piston ring 110, showing that the coated keystone piston ring 110 includes a keystone piston ring body 112 with side surfaces 118 each disposed at an angle relative to the outer diameter surface 114 and extending toward one another, and inwardly from the outer diameter surface 114 to the inner diameter surface 116. In addition, the outer diameter surface 114 of the keystone piston ring body 112 can be slightly convex, and the inner diameter surface 116 can be slightly concave.

The coated piston ring 10, 110 also includes a CVD coating 22 deposited on a plurality of the surfaces 14, 114,

16, 116, 18, 118 of the ring body 12, 112 and preferably all of the surfaces 14, 114, 16, 116, 18, 118 of the ring body 12, 112, including the outer diameter surface 14, 114, the inner diameter surface 16, 116, and the side surfaces 18, 118, but not on the cut surfaces facing the opening 20, 120.

The portion of the CVD coating 22 disposed along the outer diameter surface 14, 114 of the ring body 12 provides a running face for engaging a cylinder bore (not shown) during operation of the reciprocating engine. The CVD coating 22 can be applied to the surfaces 14, 114, 16, 116, 18, 118 of multiple piston ring bodies 12, 112 in a single coating run. Thus, a plurality of the coated piston ring 10, 110 can be manufactured in a shorter amount of time and with lower manufacturing costs, compared to coated piston rings of the prior art, which are formed using methods that require multiple runs to coat the surfaces.

The CVD coating 22 includes at least one layer 24, but can include multiple layers 24, as shown in FIG. 1A. For example, the CVD coating 22 can include a base layer, a middle layer, and a top layer. Various different compositions can be used to form the CVD coating 22, such as a composition including at least one of nitrogen and carbon, and at least one of titanium chromium hafnium. Example compositions include TiN, CrN, HfN, TiCN, TiC, and CrC. The composition of the CVD coating 22 preferably provides a high wear resistance. According to one embodiment, the CVD coating 22 comprises multiple layers 24, wherein the base layer includes TiC, the middle layer includes $Al_2O_3$, and the top layer includes TiN. According to another embodiment, wherein the CVD coating 22 comprises multiple layers 24, the base layer includes TiC, the middle layer includes TiCN, and the top layer includes TiN. The thickness of each layer 24 of the CVD coating 22 may vary, but the coating 22 typically has a total thickness of about 10 μm to about 50 μm. A heat treatment and finishing steps are typically applied to the coated piston ring 10, 110 after the CVD coating 22 is deposited on the ring body 12, 112.

An exemplary method used to form the coated piston ring 10 of FIG. 1 is shown in FIG. 3. The method includes providing the first metal material used to form the ring body 12, which is typically the iron-based material. This step includes providing a wire formed of the first metal material. The wire includes the outer diameter surface 14, the inner diameter surface 16, and the side surfaces 18. According to one embodiment, the method includes forming a groove (not shown) along the outer diameter surface 14 of the wire; embedding a second metal material (not shown) distinct from the first metal material in the outer diameter surface 14 of the wire; or inlaying the outer diameter surface 14 of the wire.

Figure 5:
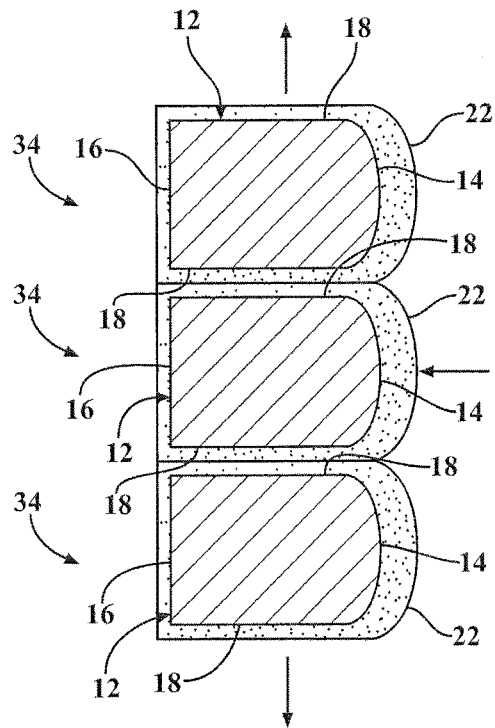
FIG. 5 is a cross-sectional view of windings of the coil of FIG. 4 along line B-B after applying a CVD coating.

Next, the method includes coiling the wire. This step includes winding the wire circumferentially around a center axis A to provide a coil 32, as shown in FIG. 4. The coil 32 includes a plurality of windings 34 extending continuously along and circumferentially around the center axis A. Each winding includes the outer diameter surface 14, the inner diameter surface 16, and the side surfaces 18. A cross-sectional view of three windings 34 of the coil 32, after the coating step, is shown in FIG. 5. The windings 34 are either spaced slightly from one another or engage one another.

After coiling the wire, the method includes applying the CVD coating 22 to all of the surfaces 14, 16, 18 of each winding 34 of the coil 32 during a single continuous period of time, which is also referred to as a single coating run or a single application step. The coating is applied to the outer diameter surface 14, the inner diameter surface 16, and the side surfaces 18 during the single period of time.

Figure 6:
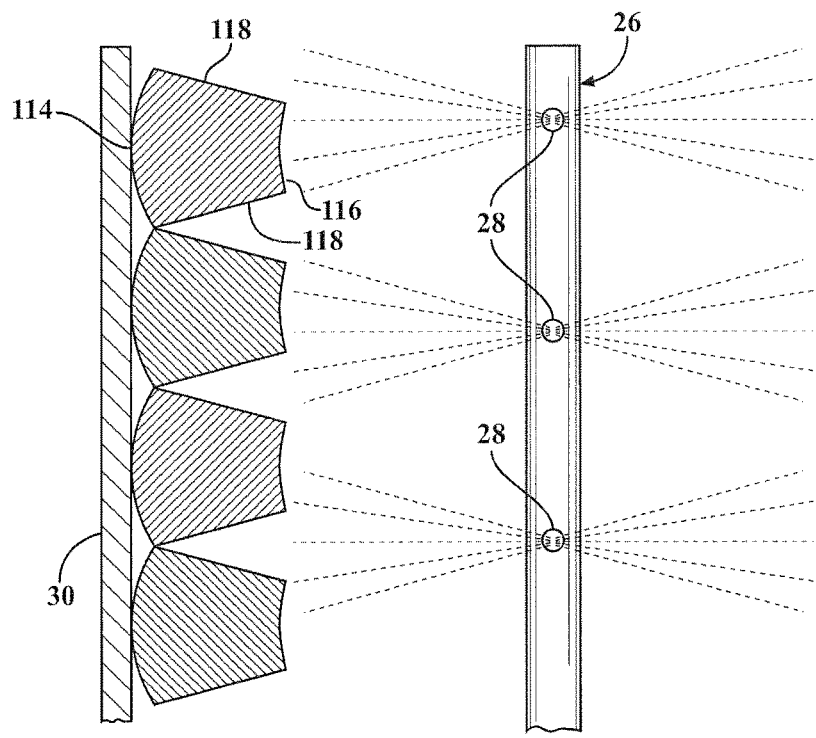
FIG. 6 is a cross-sectional view of portion of a stack of keystone piston rings during a CVD process.

In another embodiment, wherein the method includes forming coated keystone piston rings 110, instead of providing the coil 32, the method includes providing a stack of the keystone piston ring bodies 112 each formed of the first metal material, and then applying the CVD coating 22 to all of the surfaces 114, 116, 118 of each keystone piston ring body 112 in a single application step. FIG. 6 shows a portion of the stack of the keystone piston ring bodies 112 during the CVD coating process. In this embodiment, the cut surfaces along the opening 120 can be coated during the single coating run.

A chemical vapor deposition (CVD) process is used to coat the surfaces 14, 114, 16, 116, 18, 118 of the ring bodies 12, 112 with only a single coating run. Any type of CVD process known in the art can be used. Examples of types of CVD processes that can be used include atmospheric pressure CVD, low-pressure CVD, and plasma-enhanced CVD. The CVD process can be conducted at a high temperature, such as 900 to 1050° C., a medium temperature, such as 700 to 900° C., or a low temperature, such as not greater than 500° C. According to one embodiment, the process includes disposing the coil 32 or the keystone piston ring bodies 112 in a reaction chamber, heating the coil 32 or the keystone piston ring bodies 112, providing the composition used to form the CVD coating 22 in the form of a gas, applying the gas to the heated coil 32 or keystone piston ring bodies 112 in the reaction chamber, and depositing the coating 22 on the heated coil 32 or keystone piston ring bodies 112. In one embodiment, a tube 26 with a plurality of orifices 28 is disposed in the reaction chamber, and the gas is supplied through the tube and orifices to provide a more even distribution, as shown in FIG. 6.

While applying the coating, the method includes typically includes maintaining the windings 34 of the coil 32 or the keystone piston ring bodies 112 in a fixed position relative to the adjacent windings 34 or keystone piston ring bodies 112. For example, the coil 32 can be suspended in a fixed position with each winding 34 spaced from an adjacent winding 34 by not greater than 1 μm while applying the coating 22. All of the surfaces 14, 16, 18 of the coil 32 are coated without having to rotate or move the coil 32 during the CVD process. Also, a cylinder 30, for example a graphite cylinder, may be disposed around the stack of keystone piston ring bodies 112 to hold the ring bodies 112 in position during the CVD process. All of the surfaces 114, 116, 118 of the keystone piston ring bodies 112 are coated without having to rotate or move the keystone piston ring bodies 112 during the CVD process.

The composition of the gas undergoes a chemical reaction and/or decomposes upon contacting the heated coil 32 or keystone piston ring bodies 112 and provides a dense deposit on the coil 32 or keystone piston ring bodies 112. Any volatile by-products produced during the chemical reaction can be removed by gas flow through the reaction chamber. The CVD process can include applying a single layer 24, or multiple layers 24. The layers 24 may include the same composition or different compositions.

The CVD process is a non-line of sight process, and therefore all surfaces 14, 16, 18 of the coil 32 and all surfaces 114, 116, 118 of the keystone piston ring bodies 112 are coated in a single run, even surfaces close to one another, such as surfaces spaced from one another by not greater than 1 μm, or surfaces that are touching one another. FIG. 5 shows an example of adjacent coated piston rings 10 with side surfaces 18 less than 1 μm apart, which were coated in a single application step. All of the surfaces 14, 16, 18 of the coil 32 or all surfaces 114, 116, 118 of the keystone piston rings 110 can be coated by applying the composition to the coil for a single continuous period of time. The coil 32 and keystone piston rings 110 do not need to be rotated, and there is no need for separate coating deposition steps to coat the separate surfaces 14, 114, 16, 116, 18, 118. Accordingly, the method provides reduced manufacturing time and costs, compared to methods used to form coated piston rings of the prior art.

Once the CVD coating is applied to the coil 32, the method includes splitting the coil 32 into a plurality of separate windings, wherein each winding provides one of the coated piston rings 10. The splitting step typically includes cutting the coil 32 according to methods known in the art. The cut surfaces along the opening 20 are the only surfaces that are not coated.

The method can further include heat treating the coated piston rings 10, 110 to increase the hardness of the metal material of the ring body 12, 112. The heat treating step can include various different types of hardening steps, such as heating and quenching, tempering, austempering, martempering, or a combination thereof. Austempering is typically used when the ring body 12, 112 is formed of a ferrous metal material, such as steel and ductile iron. It is an isothermal heat treatment that produces a lower bainite microstructure in steel, and produces an acicular ferrite and high carbon structure in cast irons. Martempering is a heat treatment typically used when the piston body 12, 112 is formed of steel. The martempering step includes austenitisation followed by step quenching at a rate fast enough to avoid the formation of ferrite, pearlite or bainite to a temperature slightly above the martensite start point. According to one embodiment, the heat treating step includes vacuum or inert gas heat treatment to prevent possible oxidation of the CVD coating 22.

The method can also include finishing steps, such as post coating the running face of the coated piston ring 10, 110. The finishing steps can also include grinding, polishing, and/or lapping the side surfaces 18, 118 of the coated piston ring 10, 110.

Obviously, many modifications and variations of the present invention are possible in light of the above teachings and may be practiced otherwise than as specifically described while within the scope of the claims.

The invention claimed is:

1. A method of forming a plurality of coated piston rings, comprising the steps of:
   providing a coil formed of a first metal material and including a plurality of windings, each winding including an inner diameter surface, an outer diameter surface, and side surfaces extending from the inner diameter surface to the outer diameter surface;
   applying a coating to the coil during a single period of time by a chemical vapor deposition (CVD) process, wherein the windings of the coil are spaced from one another while applying the coating so that all of the surfaces of the coil are coated during the single period of time; and
   splitting the coated coil into a plurality of coated piston rings.

2. The method of claim 1, wherein the windings extend continuously along and circumferentially around a center axis; and including the step of maintaining the coil in a fixed position with each winding spaced from an adjacent winding by not greater than 1 μm while applying the coating.

3. The method of claim 1, wherein the windings extend continuously along and circumferentially around a center axis; and including the steps of disposing a tube with a plurality of orifices along the center axis; and supplying gas including the composition of the coating through the orifices of the tube during the CVD process.

4. The method of claim 1, wherein the composition of the coating includes at least one of nitrogen and carbon, and at least one of titanium, chromium, and hafnium.

5. The method of claim 4, wherein the coating includes a plurality of layers, wherein each layer includes at least one of TiN, CrN, HfN, TiCN, TiC, CrC, and $Al_2O_3$.

6. The method of claim 5, wherein the plurality of layers includes a base layer formed of TiC, a middle layer formed of $Al_2O_3$, and a top layer formed of TiN.

7. The method of claim 1, wherein the CVD process includes heating the coil in a reaction chamber; supplying a gas including the composition of the coating to the reaction chamber; and depositing the composition on all surfaces of the heated coil.

8. The method of claim 7, wherein the composition of the coating includes at least one of TiN, CrN, HfN, TiCN, TiC, CrC, and $Al_2O_3$.

9. The method of claim 1, wherein the CVD process is conducted at atmospheric pressure.

10. The method of claim 1, wherein the CVD process is conducted at a temperature not greater than 500° C.

11. The method of claim 1, wherein the CVD process is conducted at a temperature of 700 to 1050° C.

12. The method of claim 1 including providing a wire of the first metal material; forming the wire into the coil; and at least one of the following steps: forming a groove along an outer diameter surface of the wire; and embedding a second metal material distinct from the first metal material in an outer diameter surface of the wire.

13. The method of claim 1, wherein the surfaces extend circumferentially around a center axis.

14. A method of forming a plurality of coated keystone piston rings, comprising the steps of:
   providing a stack of keystone piston ring bodies each formed of a first metal material, each keystone piston ring body includes an inner diameter surface, an outer diameter surface, and a pair of side surfaces extending from the inner surface to the outer diameter surface, the side surfaces extend inwardly toward one another at an angle from the outer diameter surface to the inner diameter surface, the outer diameter surface is convex, and the inner diameter surface is concave; and
   applying a coating to all surfaces of the keystone piston ring bodies during a single period of time by a chemical vapor deposition (CVD) process.

15. The method of claim 14, wherein the surfaces extend circumferentially around a center axis.

16. The method of claim 14, including maintaining each keystone piston ring body in a fixed position relative to the adjacent keystone piston ring body while applying the coating.

17. The method of claim 16, including disposing a cylinder around the stack of keystone piston ring bodies to maintain the keystone piston ring bodies in the fixed position.

18. The method of claim 14, wherein each keystone piston ring body extends circumferentially around a center axis; and including disposing a tube with a plurality of orifices along the center axis; and supplying gas including the composition of the coating through the orifices of the tube during the CVD process.

19. The method of claim 1, wherein each keystone piston ring body in the stack is spaced from an adjacent keystone piston ring body by not greater than 1 μm while applying the coating.

20. A method of forming a plurality of a coated piston rings, comprising the steps of:
providing a wire formed of an iron-based material;
winding the wire around a center axis to form a coil with a plurality of windings extending continuously along and circumferentially around a center axis, each winding including an inner diameter surface, an outer diameter surface, and side surfaces extending from the inner diameter surface to the outer diameter surface;
disposing the coil in a reaction chamber; heating the coil in the reaction chamber;
supplying a gas to the reaction chamber, wherein the gas includes at least one of the following compositions: TiN, CrN, HfN, TiCN, TiC, CrC, and $Al_2O_3$;
depositing a coating formed of the at least one composition on all of the surfaces of the coil during a single continuous period of time, wherein the windings of the coil are spaced from one another while depositing the coating so that all of the surfaces of the coil are coated during the single period of time;
maintaining the coil in a fixed position with each winding spaced from an adjacent winding by not greater than 1 μm while depositing the coating on the surfaces;
supplying a flow of gas through the reaction chamber to remove any volatile by-products from the reaction chamber;
splitting the coated coil into a plurality of separate coated piston rings each including an inner diameter surface, an outer diameter surface, and side surfaces each extending circumferentially around a center axis and including the coating deposited on each of the surfaces;
hardening the iron-based material of the coated piston ring; and
the hardening step including at least one of the following steps: heating and quenching, tempering, austempering, and martempering.

* * * * *